United States Patent [19]
Kasten

[11] Patent Number: 6,114,858
[45] Date of Patent: Sep. 5, 2000

[54] SYSTEM FOR MEASURING NOISE FIGURE OF A RADIO FREQUENCY DEVICE

[75] Inventor: Jeffery Scott Kasten, Tigard, Oreg.

[73] Assignee: Credence Systems Corporation, Fremont, Calif.

[21] Appl. No.: 09/181,940

[22] Filed: Oct. 28, 1998

[51] Int. Cl.[7] ........................................ G01S 7/40
[52] U.S. Cl. ............................. 324/616; 324/614
[58] Field of Search ..................... 324/613, 614, 324/628; 702/69, 65; 455/135, 226.3; 374/290; 359/337

[56] References Cited

U.S. PATENT DOCUMENTS

| | | | |
|---|---|---|---|
| 4,491,783 | 1/1985 | Sawayama et al. | 324/614 |
| 4,905,308 | 2/1990 | Davidson | 324/613 |
| 5,191,294 | 3/1993 | Grace et al. | 324/613 |
| 5,970,429 | 10/1999 | Martin | 324/613 |

*Primary Examiner*—Safet Metjahic
*Assistant Examiner*—Vincent Q. Nguyen
*Attorney, Agent, or Firm*—Daniel J. Bedell; Smith-Hill and Bedell

[57] ABSTRACT

Noise factor of a radio-frequency device under test (DUT) is determined by driving the input of the DUT with a randomly modulated sine wave and measuring the power of a resulting DUT OUTPUT signal within each of a set of equally-sized frequency bands. The noise factor is computed as a combination of the power of the modulated sine wave within each of a plurality of frequency bands and the measured power of the DUT OUTPUT signal within that same plurality of frequency bands.

21 Claims, 2 Drawing Sheets

SYSTEM FOR MEASURING NOISE FIGURE OF A RADIO FREQUENCY DEVICE

BACKGROUND OF THE INVENTION

1. Field of the Invention

The present invention relates in general to systems for measuring the noise figure of a radio frequency device and in particular to a system for measuring noise figure employing a randomly modulated signal as a device stimulus.

2. Description of Related Art

Noise figure F, a commonly used measure of the noise produced by radio frequency devices, is defined as the signal-to-noise ratio $P_{SI}/P_{NI}$ of the device's input signal divided by the signal-to-noise ratio $P_{SO}/P_{NO}$ of the device's output signal:

$$F=(P_{SI}/P_{NI})/(P_{SO}/P_{NO}) \quad [1]$$

An electronic device has a gain (or loss) G where $$G=P_{SO}/P_{SI} \quad [2]$$

The output signal noise $P_{NO}$ of any device includes a component $GP_{NI}$, the amplified noise in the device's input signal, and an "added noise" component $P_{NA}$ generated by the device itself:

$$P_{NO}=GP_{NI}+P_{NA} \quad [3]$$

From equations [1]–[3] we have:

$$F=1+P_{NA}/GP_{NI} \quad [4]$$

From equation [4] we see that the value of the noise figure F for a device depends on the amount of noise $P_{NI}$ in its input signal. In order for noise figure F to be a meaningful measure of noise a device produces, we must standardize the magnitude of the input signal noise $P_{NI}$ used when testing devices for noise figure F. It is also important to use an input signal having a relatively small noise power $P_{NI}$, since for high values of $P_{NI}$ the quantity $GP_{NI}$ in equation [4] could overwhelm the added noise $P_{NA}$, thereby consigning noise figure F to a narrow range of values near 1, particularly for high gain devices. By using a small standard input noise power we not only standardize the meaning of F but we also provide a wide range of possible values of noise figure F with which to characterize the noisiness of radio frequency devices.

The standard input signal noise power $P_{NI}$ used when measuring noise figure F is the very small noise power $P_0$ produced by a resistor operating at a room temperature, specifically 290 degrees Kelvin. A resistor of any size will generate the same amount of noise power. A resistor's noise power $P_N$ is evenly distributed over the radio frequency range and has a value in any frequency band of width B that is proportional to resistor temperature T, $$P_N=kTB \quad [5]$$

where k is Boltzmann's constant. A resistor held $T_0=290$ degrees Kelvin will accordingly generate a standard noise power $P_0$ over any narrow bandwidth B where $$P_0=kT_0B \quad [6]$$

Since $P_0$ has a relatively small value of $4.004 \times 10^{-21}$ Watts for each Hertz of bandwidth B, the radio frequency noise generated by a resistor at 290 degrees Kelvin makes a suitable power standard for noise figure testing.

Suppose we connect a resistor held at $T_0=290$ degrees Kelvin between ground and the input of a radio frequency device, for example an amplifier of gain G, to be tested for noise figure F. If the resistor is matched to the impedance of the amplifier input, $Z_{in}$=Resistance, then the input signal is only noise from the resistor, its output signal will be a combination of an amplified version $GP_0$ of the input signal $P_0$ and the amplifier's own added noise $P_{NA}$. By substituting $P_0$ for $P_{NI}$ in equations [3] and [4] we have $$P_{NO}=GP_0+P_{NA} \quad [7]$$

$$F=1+P_{NA}/GP_0 \quad [8]$$

Substituting equation [7] into equation [8] we have, $$F=1+(P_{NO}-GP_0)/GP_O \quad [9]$$

Since the input signal noise power $P_0=KT_0B$ is known over any narrow frequency band of interest B, then by measuring the amplifier's output power $P_{NO}$ over that band of interest we can calculate noise figure F from equation [9].

While the standard precisely defines F, it is not always practical to test a device under test (DUT) for noise figure F by applying the signal produced by a resistor held at 290 degrees K as a test signal input to a DUT. Since the value of F depends on the difference between $P_{NO}$ and $GP_0$, then when the gain G of the DUT is too large or too small, a test signal input of $P_0$ may produce an output signal power $P_{NO}$ that is too large or too small to be accurately measured. The well-known "Y-factor" method determines noise figure F in a manner that satisfies the standard definition of noise figure and yet allows us to employ test signal powers that may be larger or smaller than $P_0$.

In the Y-factor method we measure the power output $P_{HO}$ of a radio frequency DUT when it is stimulated by the noise produced by an equivalent resistor at a some "hot" temperature $T_H$ and again measure the DUT output power $P_{CO}$ when the amplifier is stimulated by a resistor at some "cold" temperature $T_C$. We then compute noise figure F from the measured values of $P_{HO}$, $P_{CO}$, $T_H$ and $T_C$.

FIG. 1 represents a radio frequency DUT 10 as an ideal (noiseless) amplifier 12 having a gain (or loss) G and a noise generator 14 producing "excess" noise power $P_E$. The excess noise power is represented as being equivalent to the noise power output of a resistor at some temperature $T_E$:

$$P_E=kT_EB \quad [10]$$

The output of noise generator 14 drives the input of a summer 16. When an external resistor 18 held at a temperature $T_I$ drives another input of summer 16, summer 16 adds the resistor's output power $P_I=kT_IB$ to the DUT's excess noise power $P_E$ and supplies the result to ideal amplifier 12. Amplifier 12 then amplifies its input signal with gain G to produce an output signal of power $$P_{NO}=GkB(T_I+T_E) \quad [11]$$

The quantity $GkBT_E$ is simply another way of expressing the added noise $P_{NA}$ produced by device 10.

The well-known "Y-factor" for a device driven alternatively by noise signals from resistors at hot and cold temperatures $T_H$ and $T_C$ is defined as $$Y=P_{HO}/P_{CO} \quad [12]$$

where $P_{HO}$ is the power of the device output signal produced in response to the hot temperature resistor and $P_{CO}$ is the power of the device output signal produced in response to the cold temperature resistor over some frequency band of interest. If we substitute $P_{HO}$ for $P_{NO}$ and $T_H$ for $T_I$ in equation [11] we have $$P_{HO}=GkB(T_H+T_E) \quad [13]$$

If we substitute $P_{CO}$ for $P_{NO}$ and $T_C$ for $T_I$ in equation [11] we have $$P_{CO}=GkB(T_C+T_E) \quad [14]$$

Substituting equations [13] and [14] into equation [12] and solving for $T_E$ we have $$T_E=(T_H-YT_C)/(Y-1) \quad [15]$$

Since $P_{NA}=GKBT_E$, then from equation [8]

$$F=1+P_E/P_0 \quad [16]$$

Since $P_E=KT_EB$ and $P_0=KT_0B$ then from equation [16]

$$F=1+T_E/T_0 \quad [17]$$

Substituting equation [15] into equation [17] and rearranging terms, we have $$F=[(T_H/T_0-1)-Y(T_C/T_0-1)](Y-1) \quad [18]$$

Thus with resistor temperatures $T_H$ and $T_C$ known, and with $T_0$ a known constant, then we can measure $P_{HO}$ and $P_{CO}$, compute Y in accordance with equation [12] and then compute F using equation [18]. Note that equation [18] is independent of bandwidth B. As long as the DUT output powers $P_{HO}$ and $P_{CO}$ are measured over the same bandwidth, it is not necessary to know the exact bandwidth over which the measurements are taken.

While this prior art Y-factor method of measuring noise figure F solves some problems, it requires the use of two resistors held at two different temperatures $T_H$ and $T_C$ or electrically equivalent noise power that must be accurately known. Automatic test equipment employing this Y-factor method require some means for separately controlling and measuring the temperature of the two resistors or generating suitable noise levels.

What is needed is a method of measuring noise figure F.

SUMMARY OF THE INVENTION

The present invention is a method and apparatus for testing noise figure F of a radio frequency device under test (DUT). In accordance with the invention, a radio frequency sine wave signal is randomly (or pseudo-randomly) modulated to provide a test signal for which power is distributed non-uniformly over the radio frequency spectrum. Thus there will be at least two test signal frequency bands $F_H$ and $F_C$, each of width B, that will convey differing signal power levels $P_{HI}$ and $P_{CI}$. Powers $P_{HI}$ and $P_{CI}$ are equivalent to the thermal noise power in bands of width B of signals produced by resistors held at differing "hot" and "cold" temperatures $T_H$ and $T_C$, respectively. In particular, $$T_H=P_{HI}/kB$$

$$T_C=P_{CI}/kB$$

where k is Boltzmann's constant.

The test signal is applied as an input signal to the DUT and a resulting DUT output signal is processed to produce a time domain data sequence representing DUT output signal magnitude as a function of time. The time domain data sequence is then transformed to a frequency domain data sequence representing the power of the DUT output signal carried in successive frequency bands of width B. Two values of the second data sequence represent output signal powers $P_{HO}$ and $P_{CO}$ signal carried in the two frequency bands $F_H$ and $F_C$. A "measured" noise figure $F_M$ is then computed as $$F_M=[(T_H/T_0-1)-Y(T_C/T_0-1)](Y-1)$$

where $Y=P_{HO}/P_{CO}$ and $T_0=290$ degrees Kelvin. The DUT's noise figure F is the computed as $$F=F_M-(F_S-1)/GAIN$$

where GAIN is the gain of the DUT and where $F_S$ is the noise figure $F_S$ of measurement system itself. When the gain of the DUT is large, or when $F_S-1$ is relatively small, the DUT noise figure F is substantially equal to the measured noise figure $F_M$.

The method of the present invention is easier to implement within an automatic test equipment environment than prior art systems because it does not require the use of resistors held at particular temperatures as test signal sources.

It is accordingly an object of the invention to provide a method and apparatus for accurately measuring the noise figure of a radio frequency device that does not require holding one or more resistors at known temperatures.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS(S)

FIG. 1 is a block diagram modeling a radio frequency device being driven by noise produced by a resistor, FIG. 2 illustrates in block diagram form an apparatus for measuring noise figure F of a radio frequency device under test (DUT) in accordance with the present invention, FIG. 3 is a plot of the power density $P'_T$ of the TEST signal of FIG. 2, and FIG. 4 illustrates the spectrum analyzer of FIG. 2 in more detailed block diagram form.

DESCRIPTION OF THE PREFERRED EMBODIMENT(S)

Noise Figure Definition

Figure 1:
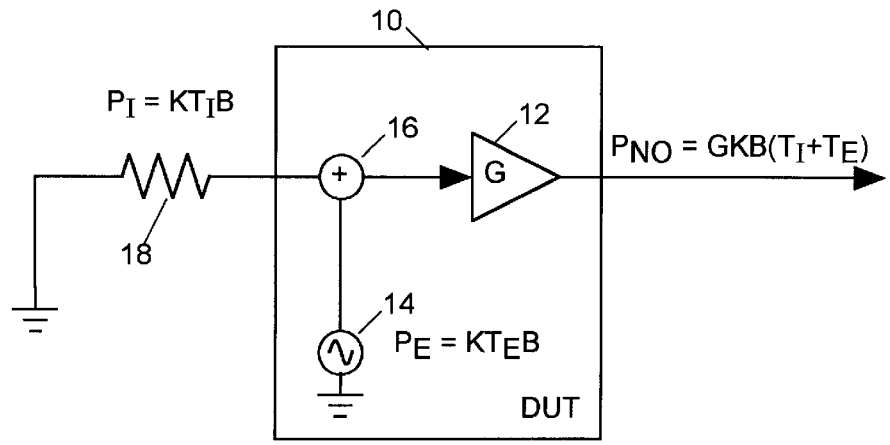

Noise figure F is a commonly used measure of the noise produced by radio frequency device under test (DUT). Noise figure is defined as $$F=1+(P_{NO}-GP_0)/GP_O \quad [19]$$

where G is the gain of the DUT, and $P_{NO}$ is the output signal power the DUT would produce within some narrow frequency band of the radio frequency spectrum when the DUT is stimulated by a test signal having power $P_0$ in that frequency band. In particular the test signal power $P_0$ is defined as the power produced by a resistor at 290 degrees K within that narrow band of the radio frequency spectrum, Within any narrow band of width B in the radio frequency spectrum, a resistor held at some temperature T produces a noise signal having a power P in any part of the radio frequency spectrum of bandwidth B of $$P = kTB \quad [20]$$

where K is Boltzmann's constant. Since resistor noise power $P_0$ produced by a resistor at 290 degrees Kelvin is relatively small and predictable, it can make a suitable standard power source when testing a radio frequency DUT for noise figure F.

Y-factor Method

While equation [19] precisely defines F, it is not always practical to directly test a DUT for noise figure F by applying the signal produced by a resistor held at 290 degrees K as a test signal input to a DUT. Since from equation [19] the value of F depends on the quantity $GP_0$, then when the gain G of the DUT is too large or too small, a test signal input of $P_0$ may produce an output signal power $P_{NO}$ that is too large or too small to be accurately measured. Also it is not always easy to accurately determine the gain of the DUT. The well-known "Y-factor" method of determining noise figure F allows us to test a DUT in a manner that satisfies the standard and yet allows us to use test signal powers that may be more suitable than $P_0$. The Y-factor method also allows us to avoid having to measure or know the gain of the DUT.

In the Y-factor method, the DUT is stimulated with an input test signal produced by a resistor held at a known "hot" temperature $T_H$. The output power $P_{HO}$ of the DUT's output signal within some narrow frequency band of width B then measured. The DUT is also stimulated with an input test signal produced by a resistor held at a known "cold" temperature $T_C$. The output power $P_{CO}$ of the DUT's output signal is the measured over the same narrow frequency band. The noise figure F of the DUT is then computed as:

$$F = [(T_H/T_0 - 1) - Y(T_C/T_0 - 1)](Y - 1) \quad [21]$$

where $$Y = P_{HO}/P_{CO} \quad [22]$$

and $$T_0 = 290 \text{ degrees Kelvin} \quad [23]$$

The particular values of $T_H$ and $T_C$ can be chosen so that the DUT output power levels $P_{HO}$ and $P_{HC}$ are within ranges that are appropriate for the DUT and which can be conveniently measured.

Although the Y-factor method frees us from having to use a particular test signal power level, certain aspects of the prior art Y-factor method make it less than satisfactory for use in an high-speed testing environment. A tester using this method would have to be able to precisely adjust the noise temperatures to two different values. Any switch that it uses to alternately connect the two noise powers to the DUT must be matched to their resistances, and the time the tester may require to perform an output signal power level measurement for each of two different input signal levels can be lengthy.

In accordance with the invention, the Y-factor method of measuring noise figure is improved by using a randomly (or pseudo-randomly) modulated sine wave signal as a test signal input to a DUT instead of the output signals of hot and cold resistors.

Tester Architecture

Figure 2:
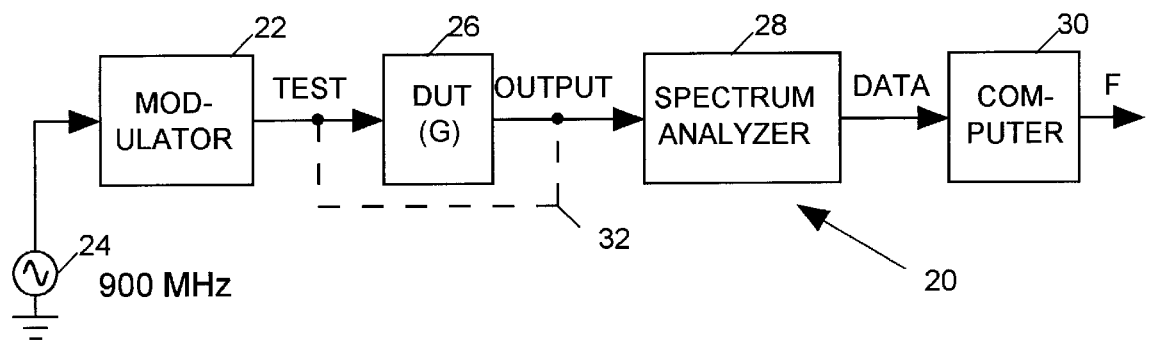

FIG. 2 illustrates in block diagram form an apparatus 20 for measuring noise figure F of a radio frequency device under test (DUT) 26 in accordance with the present invention. A binary phase shift keyed (BPSK) modulator circuit 22 randomly modulates a single-frequency (suitably 900 MHz) sine wave signal from a signal source 24 to produce a test signal (TEST) input to a DUT 26. DUT 26 amplifies its input TEST signal with a gain (or loss) of G to produce an output signal (OUTPUT). A spectrum analyzer 28 processes the OUTPUT signal to produce a data sequence (DATA) input to a computer 30. Successive data elements of the DATA sequence indicate the total OUTPUT signal power included in successive bands of width B of the radio frequency spectrum. Computer 30 computes the noise figure F of the DUT based on the information contained in the DATA sequence and on the characteristics of the TEST signal.

Test Signal Characteristics

Figure 3:
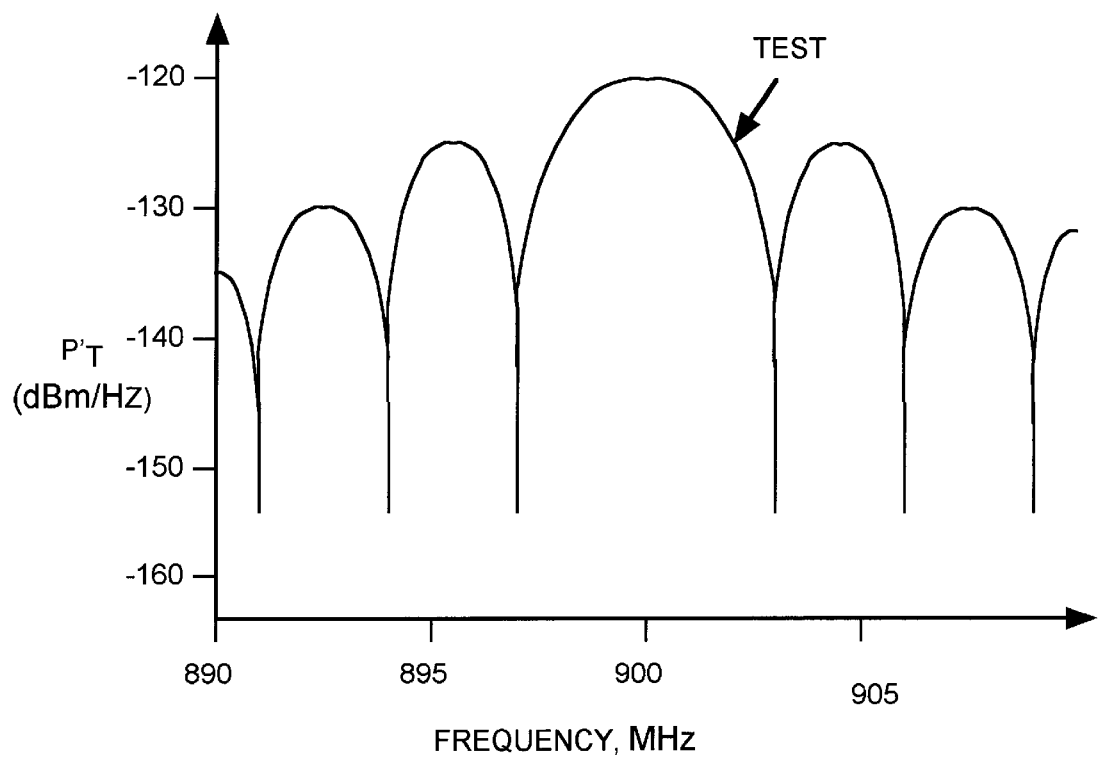

FIG. 3 is a plot of the power density $P'_T$ (in dBm/Hz) as a function of frequency for the TEST signal of FIG. 2. While the power density spectrum of the sine wave signal output of signal generator 24 has a single power spike at 900 MHz, when we randomly modulate the sine wave signal output of signal generator 24, the resulting TEST signal is wideband in nature having a power density that is non-zero over a large portion of the radio frequency band. The total power $P_T$ contained in any small frequency band of width B can be determined by integrating the TEST signal frequency spectrum of FIG. 3 over that frequency band. If, for example, the portion of the frequency spectrum between 900 and 903 MHz is divided into successive frequency bands of uniform width B then total power $P_T$ for each band may be found by integrating the TEST signal power density $P'_T$ over each band. For a narrow band width of, for example 1 Hz, the total power for each band power approximately equal to 1 Hz times the power density $P'_T$ Hz at the center of the band. In the 1 Hz wide frequency band between 900 MHz and 900.000001 MHz, the total signal power $P_H$ is approximately −120 dBm. The same level of power would be generated by a resistor held at some "hot" temperature $T_H$ where $$T_H = P_H/kB \quad [24]$$

In another band of width B=1 Hz between 902 MHz and 902.000001 MHz, the total signal power $P_C$ is approximately −130 dBm, a power level equivalent to that generated by a resistor held at some "cold" temperature $T_C$ where $$T_C = P_C/kB \quad [25]$$

Noise Factor Computation

As mentioned above, successive data elements of the DATA sequence output of spectrum analyzer 28 indicate the total OUTPUT signal power included in successive bands of width B of any desired portion of the radio frequency spectrum. With bandwidth width B chosen to be 1 Hz, one of those DATA sequence values will indicate an output power $P_{HO}$ of DUT 26 at the frequency band between 900 MHz and 900.000001 MHz. Another of those DATA sequence values will indicate an output power $P_{CO}$ of DUT 26 at the frequency band between 902 MHz and 902.000001 MHz. Computer 30 obtains values of $P_{HO}$ and $P_{CO}$ for the two frequency bands from the DATA sequence. Computer 30 consults a pre-loaded lookup table for power levels of the TEST signal to select TEST signal levels $P_H$ and $P_C$ for the same two frequency bands, and then computes the noise figure F of DUT 26 using equations [21]–[25].

Correction for Measurement Noise

The spectrum analyzer 28 of FIG. 2 produces thermal noise that adds to the noise generated by DUT 26. Thus the value of F computer 30 computes from equations [21]–[25] is somewhat smaller than the true value of F for DUT 26. When the measurement system noise power $P_M$ generated by spectrum analyzer 28 is significant in compared to the noise power generated by DUT 26, then the value of F computed from equations [21]–[25] should be adjusted to account for the contribution to noise figure F provided by measurement system noise.

Let us define $F_{DUT}$ as the noise figure of DUT 26 of FIG. 2, $F_M$ as the noise figure of the analog portions of spectrum analyzer 28, and $F_{TOT}$ at the total noise figure for the DUT and spectrum analyzer in series. It is well-known that for such series connected devices, the following relationship holds true:

$$F_{TOT}=F_{DUT}+[(F_M-1)/G] \qquad [26]$$

where G is the gain of the DUT. Rearranging equation [26] we have:

$$F_{DUT}=F_{TOT}-[(F_M-1)/G] \qquad [27]$$

Thus to determine $F_{DUT}$, computer 30 computes noise figure $F=F_{TOT}$ from the DATA output of spectrum in the manner described above, and then subtracts the quantity $(F_M-1)/G$ in accordance with equation [27]. To determine the value of the quantity $(F_M-1)/G$ computer 30 must know the gain G of DUT 26 and the value of measurement system noise figure $F_M$. Systems for measuring the gain G of a DUT are well-known to those skilled in the art and are not further detailed herein. To determine the value of $F_M$, DUT 26 is replaced with a conductive path 32 so that the TEST signal is applied directly as input to spectrum analyzer 28. When computer 30 then calculates a noise figure value F from the DATA sequence produce by spectrum analyzer 28 in the manner described above, the computed noise figure is measurement system noise figure $F_M$.

Noise Factor Averaging

In the example described above, noise figure F was computed using only two data elements from the DATA sequence output of spectrum analyzer 28, the two DATA sequence elements indicating the power carried in the two 1 Hz OUTPUT signal frequency bands starting at 900 and 902 MHz. However computer 30 could compute a noise figure F in the manner described above from DATA sequence elements corresponding to any two frequency bands for which the TEST signal has differing power levels. Since the DATA sequence output of spectrum analyzer 28 includes a large number of data elements representing the power levels in many similarly sized frequency bands, host computer 30 computes a value of noise factor F for each of many different pairs of DATA sequence elements (and their corresponding TEST signal power levels $P_H$ and $P_C$) and then processes the set of computed values of $F_{DUT}$ using a least squares fit (or any other well-known averaging method) to produce an output noise figure $F_{DUT}$ that is less prone to error than noise figure value based on only one pair of DATA sequence elements.

Figure 4:
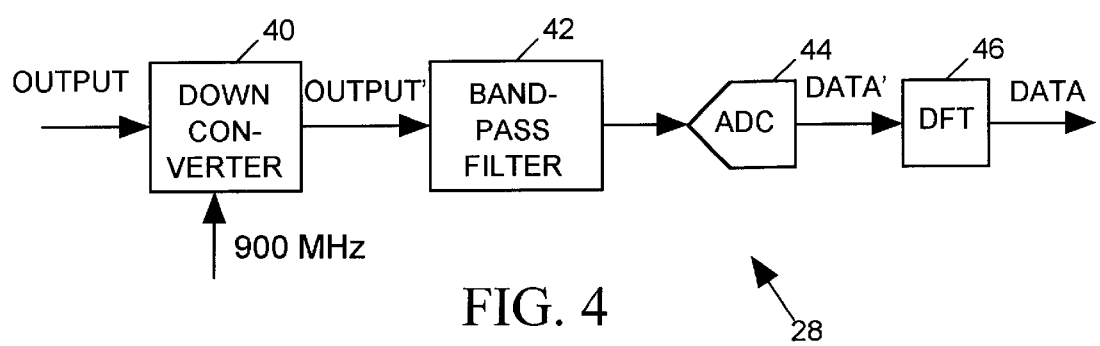

FIG. 4 illustrates a spectrum analyzer 28 of FIG. 2 in more detailed block diagram form. Spectrum analyzer 28 includes a down converter 40 for converting the OUTPUT signal to a signal OUTPUT' having a frequency spectrum shifted 900 MHz, a bandpass filter 42 for filtering the OUTPUT' signal to remove frequencies outside a range of interest, an analog-to-digital converter (ADC) 44 for digitizing the filtered OUTPUT' signal at a rate at least twice its highest frequency to produce and output data sequence DATA'. The DATA' data sequence represents the magnitude of the OUTPUT signal as a function of time over a frequency range of interest. A digital filter 46 implements a discrete Fourier transform such as the well-known fast Fourier transform (FFT) to convert the DATA' sequence into the output DATA sequence representing the power of the OUTPUT signal in each of a set equal-sized frequency bands within the frequency range of interest.

In an alternative embodiment of the invention, computer 30 of FIG. 2 carries out the function of filter 46, by receiving the DATA' output of ADC 44 and executing a well-known discrete Fourier transform algorithm to convert the time-domain DATA' sequence to the frequency DATA sequence.

While the forgoing specification has described a preferred embodiment of the present invention, one skilled in the art may make many modifications to the preferred embodiment without departing from the invention in its broader aspects. For example while the test apparatus 20 of FIG. 2 is illustrated as employing a 900 MHz sine wave signal generator, other signal types and frequencies could be employed. While in the preferred embodiment of the invention described herein modulator 22 of FIG. 2 is a BPSK modulator, other types of modulators could implement modulator 22, including but not limited to, quadrature phase shift keyed (QPSK), quadrature amplitude modulation (QAM), frequency modulation (FM), amplitude modulation (AM), and vector modulations (I/Q), or any combination thereof. The only requirement is that output of signal generator 24 be randomly modulated over some radio frequency band of interest so that the power density of the resulting TEST signal varies with frequency in some known fashion. While spectrum analyzer 28 is described as being of a particular type, spectrum analyzers having other architectures could be employed provided they produce the DATA sequence described above. The appended claims therefore are intended to cover all such modifications as fall within the true scope and spirit of the invention.

What is claimed is:

1. A method for determining noise factor of a device under test (DUT) comprising the steps of:

applying a TEST signal as input to said DUT wherein said TEST signal concurrently has a first power $P_H$ within a first frequency band and a second power $P_C$ within a second frequency band, wherein said first and second frequency bands span differing frequency ranges of said test signal such that said DUT produces an OUTPUT signal in response to said TEST signal, wherein said OUTPUT signal has a third power $P_{HO}$ within said first frequency band and has a fourth power $P_{CO}$ within said second frequency band, measuring said third power $P_{HO}$ and said fourth power $P_{CO}$ of said OUTPUT signal; and computing a noise factor as a combination of values of said first power $P_H$, second power $P_C$, third power $P_{HO}$ and fourth power $P_{CO}$.

2. The method in accordance with claim 1 wherein said first power $P_H$ is substantially greater than said second power $P_C$.

3. The method in accordance with claim 1 wherein said TEST signal is a wideband signal having a power density that is non-zero at all frequencies within a range of frequencies including said first frequency band and said second frequency band.

4. The method in accordance with claim 3 wherein the TEST signal power density varies substantially with frequency over said range of frequencies.

5. The method in accordance with claim 1 further comprising the steps of:

generating a single-frequency signal, and modulating said single-frequency signal to produce said TEST signal.

6. The method in accordance with claim 5 wherein in the step of modulating said single-frequency signal to produce said TEST signal, said single-frequency signal is pseudo-randomly modulated.

7. The method in accordance with claim 1 wherein said first frequency band and said second frequency band are of equal band width.

8. The method in accordance with claim 7 wherein the step of computing a noise factor as a combination of values of said first power $P_H$, second power $P_C$, third power $P_{HO}$ and fourth power $P_{CO}$ comprises the substep of computing the quantity $$[(T_H/T_0-1)-Y(T_C/T_0-1)](Y-1)$$

where $Y=P_{HO}/P_{CO}$, $T_0$ is a constant, $T_H=P_H/kB$, $T_C=P_C/kB$, k is Boltzmann's constant, and B is said bandwidth.

9. The method in accordance with claim 8 wherein $T_0$ is 290 degrees Kelvin.

10. The method in accordance with claim 1 wherein the step of measuring said third power $P_{HO}$ and said fourth power $P_{CO}$ of said OUTPUT signal comprises the substep of applying said OUTPUT signal as input to a spectrum analyzer of the type which produces an output DATA sequence having a plurality of data elements, wherein successive data elements of sequence indicates powers of successive frequency bands of said OUTPUT signal, said successive frequency bands of said OUTPUT signal including said first frequency band and said second frequency band.

11. The method in accordance with claim 10 wherein said spectrum analyzer performs the substeps of:

producing time-domain data representing the time-varying behavior of the OUTPUT signal, and converting said time-domain data to said output DATA sequence via discrete Fourier transform.

12. A method for determining noise factor of a device under test (DUT) comprising the steps of:

applying a TEST signal as input to said DUT, wherein said TEST signal has substantial power within each of a plurality of frequency bands, wherein said plurality of frequency bands span differing frequency ranges of said test signal such that said DUT produces an OUTPUT signal in response to said TEST signal, said OUTPUT signal having substantial power each of said frequency bands, measuring power of said OUTPUT signal within each of said plurality of frequency bands; and computing a noise factor as a combination of values of the power of said TEST signal and the measured power of said OUTPUT signal in at least two of said frequency bands.

13. The method in accordance with claim 12 further comprising the steps of:

generating a single-frequency signal, and modulating said single-frequency signal to produce said TEST signal.

14. The method in accordance with claim 1 wherein all of said plurality of frequency bands are of equal band width.

15. The method in accordance with claim 14 wherein the step of computing a noise factor as a combination of values of the power of said TEST signal and the measured power of said OUTPUT signal in at least two of said frequency bands comprises the substep of computing the quantity $$[(T_H/T_0-1)-Y(T_C/T_0-1)](Y-1)$$

where $Y=P_{HO}/P_{CO}$, $T_0$ is a constant, $T_H=P_H/KB$, $T_C=P_C/KB$, K is Boltzmann's constant, $P_{HO}$ and $P_{CO}$ are measured powers of said OUTPUT signal in two of said frequency bands, $P_H$ and $P_C$ are powers of said TEST signal in said two of said frequency bands, and B is said bandwidth.

16. The method in accordance with claim 12 wherein the step of measuring power of said OUTPUT signal within each of said plurality of frequency bands comprises the substeps of applying said OUTPUT signal as input to a spectrum analyzer of the type which produces an output DATA sequence having a plurality of data elements, wherein each data elements of said DATA sequence indicates a power of said OUTPUT signal within a separate one of said plurality of frequency bands.

17. The method in accordance with claim 16 wherein said spectrum analyzer performs the substeps of:

producing time-domain data representing the time-varying behavior of the OUTPUT signal, and converting said time-domain data to said output DATA sequence via discrete Fourier transform.

18. An apparatus for determining noise factor of a device under test (DUT), the apparatus comprising:

means for generating a TEST signal input to said DUT, wherein said TEST signal concurrently has substantial power within each of a plurality of frequency bands, wherein said plurality of frequency bands span differing frequency ranges of said test signal such that said DUT produces an OUTPUT signal in response to said TEST signal, said OUTPUT signal having substantial power each of said plurality of frequency bands, means for measuring power of said OUTPUT signal in at least two of said frequency bands and for computing a noise factor as a combination of values of the power of said TEST signal in said at least two of said frequency bands and the measured power of said OUTPUT signal in said at least two of said frequency bands.

19. The apparatus in accordance with claim 13 wherein said means for generating said TEST signal comprises: comprising the steps of:

means for generating a single-frequency signal, and means for modulating said single-frequency signal to produce said TEST signal.

20. The apparatus in accordance with claim 18 wherein all of said plurality of frequency bands are of equal band width.

21. A method of measuring noise factor of a radio-frequency device under test (DUT) comprising:

driving said DUT with a randomly modulated sine wave signal, and measuring a power of a resulting DUT OUTPUT signal within each of a set of equally-sized frequency bands spanning differing frequency ranges of said output signal, and computing said noise factor as a combination of a power of the randomly modulated sine wave and the measured power of the DUT OUTPUT signal within each of said plurality of frequency bands.

* * * * *